(12) United States Patent
Zhang

(10) Patent No.: US 10,620,439 B1
(45) Date of Patent: Apr. 14, 2020

(54) PROCESSOR THERMAL MANAGEMENT FOR LIQUID CRYSTAL TEMPERATURE REGULATION

(71) Applicant: Facebook Technologies, LLC, Menlo Park, CA (US)

(72) Inventor: Rui Zhang, Redwood City, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 204 days.

(21) Appl. No.: 15/786,116

(22) Filed: Oct. 17, 2017

(51) Int. Cl.
| | | |
|---|---|---|
| *G02B 27/01* | (2006.01) | |
| *G02B 23/12* | (2006.01) | |
| *G06F 1/20* | (2006.01) | |
| *G09G 3/36* | (2006.01) | |
| *H05K 7/20* | (2006.01) | |
| *G02F 1/13* | (2006.01) | |
| *G02F 1/1333* | (2006.01) | |

(52) U.S. Cl.
CPC ....... *G02B 27/0172* (2013.01); *G02B 23/125* (2013.01); *G02F 1/132* (2013.01); *G02F 1/133382* (2013.01); *G06F 1/203* (2013.01); *G09G 3/3603* (2013.01); *G09G 3/3611* (2013.01); *H05K 7/20* (2013.01); *G09G 2320/041* (2013.01)

(58) Field of Classification Search
CPC .... G02B 27/0172; G02B 23/125; G02B 5/32; G02B 2027/0181; G02B 2027/0183; G02B 27/0103; G02B 2027/0105; G02B 2027/0107; G02B 2027/0109; G02B 2027/011; G02B 2027/0112; G02B 2027/0114; G02B 2027/0116; G02B 2027/0125; G02B 2027/0127; G02B 2027/013; G02B 2027/0134; G02B 2027/0136; G02B 2027/0174; G02B 27/0189; G02B 2027/015; G02B 23/00; G09G 3/3603; G09G 3/3611; G09G 2320/041; G02F 1/133382; G02F 1/132; H05K 7/20; G06F 1/203; G06K 9/76; G03H 2001/043; G03H 2240/25; G03H 2270/21; G03H 2222/20; G03H 2222/33; G03H 2222/40
See application file for complete search history.

(56) References Cited

U.S. PATENT DOCUMENTS

| | | | | |
|---|---|---|---|---|
| 5,504,650 | A * | 4/1996 | Katsui | .............. G06F 1/20 165/80.3 |
| 2006/0203143 | A1* | 9/2006 | Shin | .......... G02F 1/133382 349/58 |
| 2009/0308581 | A1* | 12/2009 | Tanaka | ............ G06F 1/203 165/121 |
| 2017/0184863 | A1* | 6/2017 | Balachandreswaran | ............ G02B 27/0176 |
| 2018/0081397 | A1* | 3/2018 | Yoshifumi | ...... G06F 1/203 |

* cited by examiner

*Primary Examiner* — Jennifer D. Carruth
(74) *Attorney, Agent, or Firm* — Freestone Intellectual Property Law PLLC; Aaron J. Visbeek

(57) ABSTRACT

Thermal control logic receives a temperature signal representative of a temperature of a liquid crystal display (LCD). The thermal control logic is configured to selectively drive a motion actuator to couple a heat conduction element with a heat sinking layer that receives heat from one or more processors. The heat conduction element is coupled between the heat sinking layer and the LCD.

20 Claims, 6 Drawing Sheets

US 10,620,439 B1

PROCESSOR THERMAL MANAGEMENT FOR LIQUID CRYSTAL TEMPERATURE REGULATION

TECHNICAL FIELD

This disclosure relates generally to liquid crystal displays (LCDs), including but not limited to controlling temperature of liquid crystals in the LCDs.

BACKGROUND INFORMATION

LCDs are flat-panel displays that are widely used in both consumer and commercial contexts for displaying images. Typically, LCDs include an array of liquid crystal pixels that are illuminated by a backlight or side-illumination structure and the images are generated by modulating a voltage across each liquid crystal pixel to adjust the orientation of the liquid crystals in each pixel and thus control the light output of the liquid crystal display. However, the environment that the LCD is deployed in may influence the speed and/or accuracy of controlling the liquid crystals and thus affect the viewing experience for viewers of the LCD.

SUMMARY

Embodiments of the disclosure include an apparatus including one or more processors, a heat sinking layer, a motion actuator, and thermal control logic. The heat sinking layer is coupled to sink heat from the one or more processors and the motion actuator is for coupling to a heat conduction element. The thermal control logic is coupled to drive the motion actuator and the thermal control logic is configured to receive a temperature signal representative of a temperature of a liquid crystal display (LCD). The thermal control logic may be configured to selectively drive the motion actuator to couple the heat conduction element with the heat sinking layer to form a thermal conduction path between the heat sinking layer and the LCD.

In one embodiment, a head mounted display (HMD) includes a heat sinking layer, a liquid crystal display (LCD), a temperature sensor, a heat conduction element, a motion actuator, and thermal control logic. The heat sinking layer may receive heat from processors of the HMD and the LCD may be positioned to display images to a wearer of the HMD. The temperature sensor may be configured to generate a temperature signal representative of a temperature of the LCD and the heat conduction element may be coupled between the LCD and the heat sinking layer. The motion actuator is coupled to the heat conduction element. The thermal control logic may be configured to receive the temperature signal from the temperature sensor and configured to selectively drive the motion actuator to couple the heat conduction element with the heat sinking layer in response to the temperature signal.

In one embodiment, the thermal control logic is configured to drive the motion actuator to couple the heat conduction element with the heat sinking layer when the temperature signal is below a lower temperature threshold and the thermal control logic is further configured to drive the motion actuator to decouple the heat conduction element with the heat sinking layer when the temperature signal is above an upper temperature threshold. In one embodiment, the motion actuator includes a voice coil.

In one embodiment, an LCD thermal layer may be coupled to the heat conduction element to distribute the heat from the processors across the LCD and the LCD thermal layer may be disposed on a backside of the LCD that is opposite a viewing side of the LCD. The heat conduction element may include at least one of copper or aluminum.

In one embodiment of the disclosure, a method of regulating a temperature of liquid crystal in a HMD includes receiving a temperature signal from a temperature sensor coupled to an LCD of an HMD. The heat generated by the processors of the HMD is directed to the LCD when the temperature signal is below a lower temperature threshold and the heat from the processors is directed to a chassis of the HMD when the temperature signal is above an upper temperature threshold.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of regulating a liquid crystal temperature of a liquid crystal display (LCD) are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise.

Systems, methods, and apparatuses described in this disclosure include thermal control logic configured to receive a temperature signal representative of a liquid crystal temperature of a liquid crystal display (LCD). Liquid crystal pixels of LCDs can support faster refresh rates when the liquid crystal is within a particular temperature range. The thermal control logic of the disclosure may drive a motion actuator (e.g. a voice coil) to couple (and decouple) a heat conduction element to selectively direct heat to the LCD to keep the liquid crystal within a particular temperature range. The heat conduction element is disposed between a heat sinking layer that receives heat from processors (e.g. CPU and/or GPUs) and the LCD. The embodiments of the disclosure may be implemented in a head mounted display to regulate LCD temperature to support higher refresh rates and improve augmented reality (AR) and virtual reality (VR) user experiences. These and other embodiments are described in more detail below with respect to the Figures.

Figure 1:
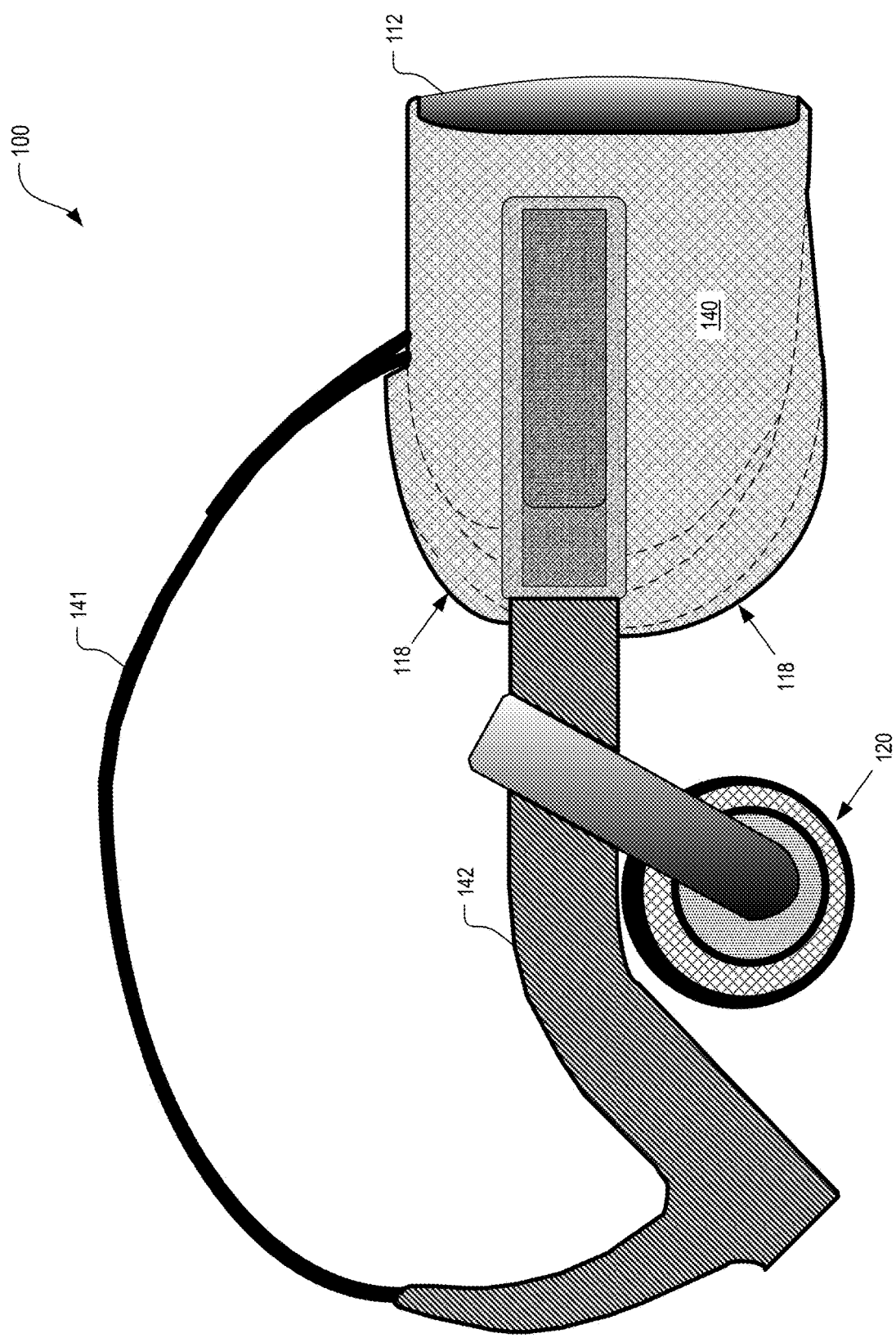
FIG. 1 illustrates an example head mounted display (HMD), in accordance with an embodiment of the disclosure.

FIG. 1 illustrates an example head mounted display (HMD) 100 including a top structure 141 and a side structure 142 attached with a viewing structure 140. The illustrated HMD 100 is configured to be worn on a head of a user of the HMD. In one embodiment, top structure 141 includes a fabric strap that may include elastic. Side structure 142 may include a fabric as well as rigid structures (e.g. plastics) for securing the HMD to the head of the user. HMD 100 may optionally include earpiece(s) 120 configured to deliver audio to the ear(s) of a wearer of HMD 100.

In the illustrated embodiment, viewing structure 140 includes an interface membrane 118 for contacting a face of a wearer of HMD 100. Interface membrane 118 may function to block out some or all ambient light from reaching the eyes of the wearer of HMD 100.

Example HMD 100 also includes a chassis 112 for supporting hardware of the viewing structure 140 of HMD 100. Hardware of viewing structure 140 may include any of processing logic, wired and/or wireless data interface for sending and receiving data, graphic processors, and one or more memories for storing data and computer-executable instructions. In one embodiment, viewing structure 140 may be configured to receive wired power. In one embodiment, viewing structure 140 is configured to be powered by one or more batteries. In one embodiment, viewing structure 140 may be configured to receive wired data including video data. In one embodiment, viewing structure 140 is configured to receive wireless data including video data.

Viewing structure 140 may include an LCD, an organic light emitting diode (OLED) display, micro-LED display, quantum dot display, pico-projector, or liquid crystal on silicon (LCOS) display for directing image light to a wearer of HMD 100. Viewing structure 140 may include viewing optics (not illustrated) to focus the image light for viewing by the user.

Figure 2:
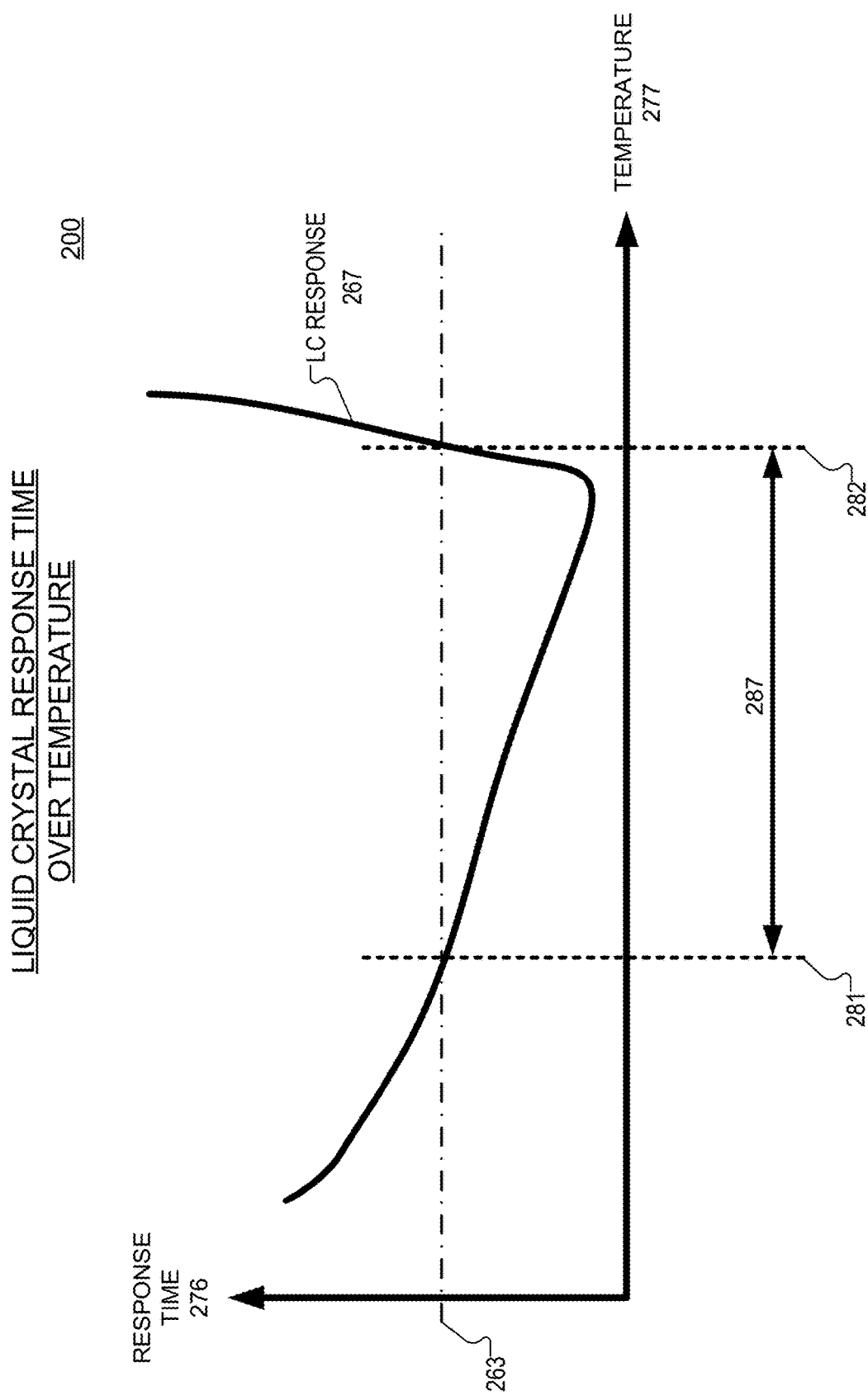
FIG. 2 includes a chart illustrating a response time of liquid crystal over temperature, in accordance with an embodiment of the disclosure.

FIG. 2 includes a chart 200 illustrating a liquid crystal response over temperature, in accordance with an embodiment of the disclosure. Chart 200 includes a response time 276 axis as the y-axis and a temperature 277 as the x-axis. The liquid crystal response time over temperature 267 is charted with respect to response time 276 and temperature 277. A lower temperature threshold 281 and an upper temperature threshold 282 define a target temperature zone 287 that is at or below a target liquid crystal response time 263.

Temperature affects the speed at which the orientation of liquid crystal in liquid crystal pixels can be switched, which in turn, affects the refresh rate of an LCD. If the liquid crystal is too cold or too hot, the refresh rate of the LCD will lag. Slower refresh rates for LCDs may generate undesirable visual artifacts such as ghosting and smearing when the images displayed on the LCD are changing rapidly. Therefore, maintaining a higher refresh rate for an LCD may be desirable to reduce the undesirable visual artifacts and controlling the temperature of the liquid crystal of the LCD may assist in supporting higher refresh rates. Contexts such as gaming, virtual reality (VR), augmented reality (AR), and action films may particularly benefit from LCDs with higher refresh rates. In the context of VR and AR, faster refresh rates may improve the user experience by decreasing undesirable motion effects experienced by a subset of users.

In one embodiment of the disclosure, the target liquid crystal response time 263 is 5 ms to support a refresh rate of approximately 200 frames per second. The lower temperature threshold 281 may be 10° C. and the upper temperature threshold may be 75° C. to support a liquid crystal response time of 5 ms. In one embodiment, the lower temperature threshold 281 may be 45° C. and the upper temperature threshold may be 70° C. to support a liquid crystal response time that is faster than 5 ms to support a refresh rate of faster than 200 frames per second.

Figure 3A:
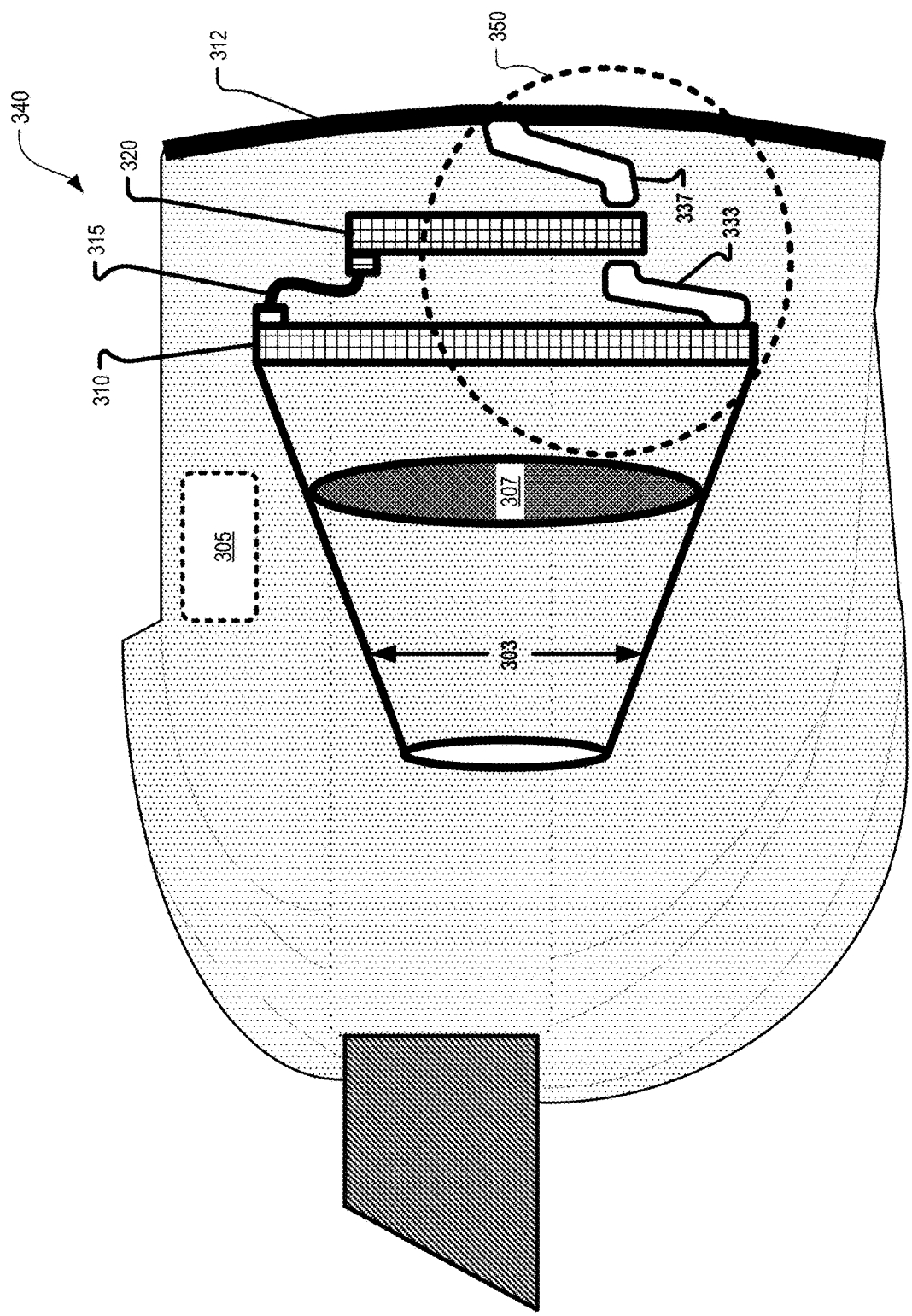
FIG. 3A illustrates an example viewing structure of an HMD that includes a display and a mainboard, in accordance with an embodiment of the disclosure.

FIG. 3A illustrates an example viewing structure 340 of an HMD (such as HMD 100) that includes an LCD 310 and a mainboard 320, in accordance with an embodiment of the disclosure. The illustrated embodiment of viewing structure 340 also includes an eye cup 303, viewing optics 307, a battery 305, a flexible circuit board 315 (also known as a "flex circuit"), a heat conduction element 333, a chassis heat conduction element 337, and a chassis 312.

Eye cup 303 includes viewing optics 307 to focus display light generated by LCD 310 for the eye(s) of a wearer of the HMD that includes viewing structure 340. Flexible circuit board 315 is coupled between LCD 310 and the mainboard 320. Mainboard 320 includes processors such as central processing units (CPUs) and/or graphics processing units (GPU). Flexible circuit board 315 is coupled to deliver image signals (such as video data) from the mainboard 320 to the LCD 310. The mainboard 320 may include an image port for connecting to the flexible circuit board 315. In one embodiment, the image port includes a connector to accept a connector of the flexible circuit board 315 for delivering image signals through the flexible circuit board.

Heat conduction element 333 is disposed between LCD 310 and mainboard 320, in FIG. 3A. Chassis heat conduction element 337 is disposed between chassis 312 and mainboard 320, in the illustrated embodiment. Chassis 312 may include plastic and/or metal.

Figure 3B:
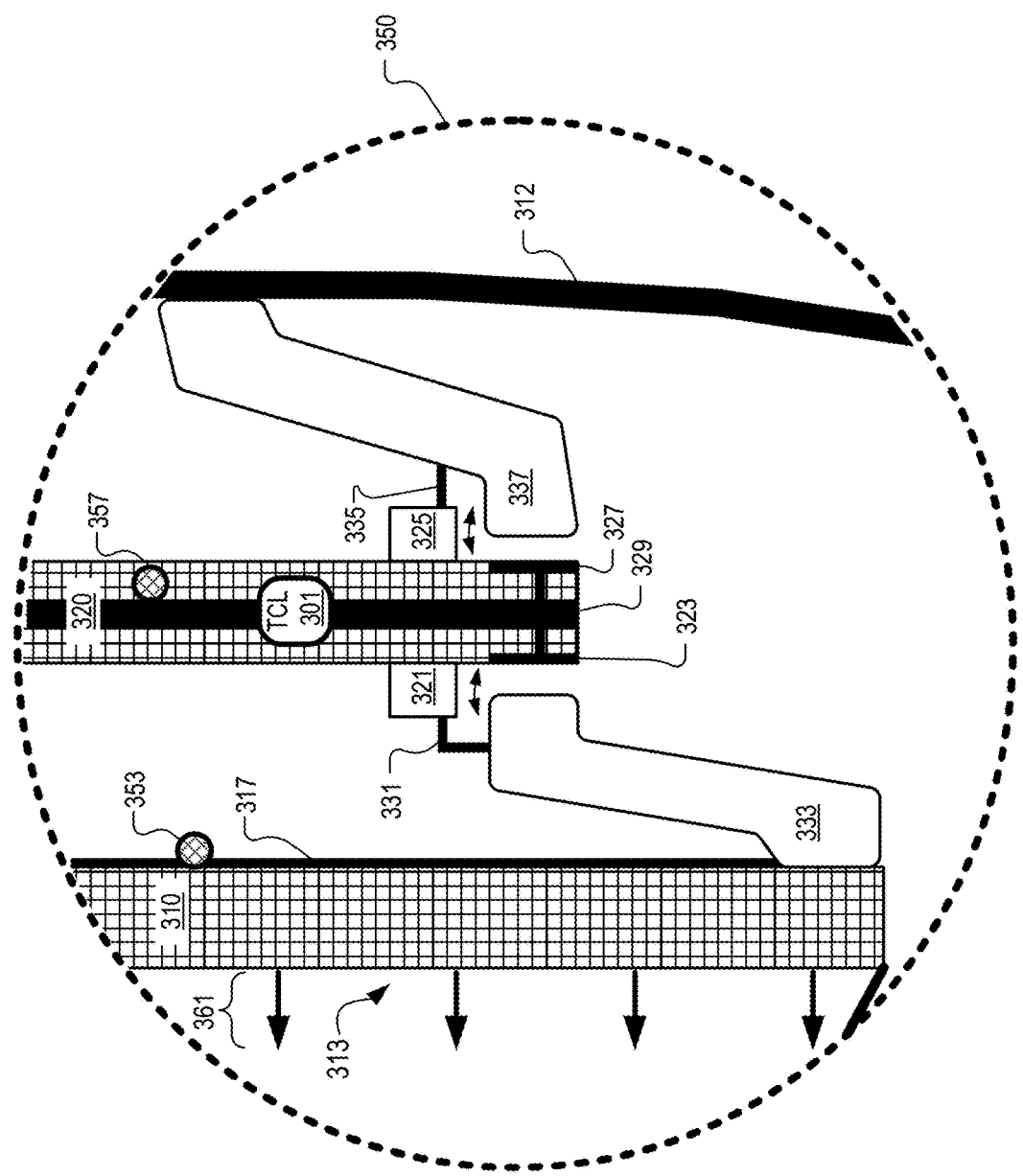
FIG. 3B illustrates a zoomed-in view of a portion of FIG. 3A that includes a display, a processing board, and motion actuators for selectively directing heat from the mainboard, in accordance with an embodiment of the disclosure.

FIG. 3B illustrates a zoomed-in view 350 of a portion of FIG. 3A that includes LCD 310, a mainboard 320, and motion actuators 321 and 325 for selectively directing heat from the mainboard 320, in accordance with an embodiment of the disclosure. In FIG. 3B, LCD 310 generates display light 361 on a viewing side 313 of LCD 310 for presenting to wearers of the viewing structure 340. A temperature sensor 353 is configured to generate a temperature signal representative of a temperature of the LCD 310. In the illustrated embodiment, temperature sensor 353 is coupled to a backside of the LCD 310. Temperature sensor 353 may generate an analog or digital signal as the temperature signal. In one embodiment, the temperature signal is routed through a conductor of the flexible circuit board 315 back to mainboard 320.

Mainboard 320 may include a second temperature sensor 357 configured to generate a second temperature signal representative of a second temperature of one or more processors disposed on mainboard 320. Temperature sensor 357 may generate an analog or digital signal as the second temperature signal. In one embodiment, mainboard 320 includes a heat sinking layer 329 for receiving heat from one or more processors disposed on the mainboard 320. The second temperature sensor 357 may be coupled to the heat sinking layer 329. In one embodiment, the heat sinking layer 329 includes copper. In one embodiment, the heat sinking layer 329 is an inner layer of a printed circuit board (PCB) included in the mainboard 320. Plated through-hole and/or blind vias may be utilized to sink heat generated by processor(s) on the surface of mainboard 320 to the heat sinking layer 329 for heat distribution away from the processors. In one embodiment, the heat sinking layer 329 includes aluminum.

Thermal control logic 301 is configured to receive the temperature signal from the temperature sensor 353. Thermal control logic 301 is at least partly disposed on mainboard 320, in the illustrated embodiment. In one embodiment, thermal control logic 301 is included in a system on a chip (SOC) included in mainboard 320. Thermal control logic 301 is further configured to selectively drive motion actuator 321 to coupled (and decouple) heat conduction element 333 with the heat sinking layer 329 in response to the temperature signal generated by temperature sensor 353. The heat sinking layer 329 may include a heat sinking surface 323. Heat sinking surface 323 may be implemented as a copper pad of a PCB. Heat conduction element 333 may be made of copper to take advantage of the softer metal characteristics of a copper-to-copper connection between heat sinking surface 323 and heat conduction element 333 to increase the surface contact between heat sinking surface 323 and heat conduction element 333. In one embodiment, heat conduction element 333 includes aluminum.

In the illustrated embodiment, heat conduction element 333 is coupled to an LCD thermal layer 317 to distribute the heat across LCD 310 for warming the liquid crystal included in the LCD. The LCD thermal layer 317 may be disposed across the backside of LCD 310 that is opposite the viewing side 313 of the LCD. In one embodiment, the LCD thermal layer 317 is a thin metal layer.

In one embodiment, thermal control logic 301 is configured to drive motion actuator 321 to couple heat conduction element 333 with the heat sinking layer 329 when the temperature signal from temperature sensor 353 is below a lower temperature threshold such as lower temperature threshold 281. Hence, when the temperature of the LCD 310 falls below a certain temperature (e.g. lower temperature threshold 281), heat from the processors of mainboard 320 can be directed to LCD 310 via heat conduction element 333. Thermal control logic 301 may also be configured to drive motion actuator 321 to decoupled heat conduction element 333 with the heat sinking layer 329 when the temperature signal from temperature sensor 353 is above an upper temperature threshold such as upper temperature threshold 282. When the temperature signal from temperature sensor 353 is above the upper temperature threshold, chassis heat conduction element 337 may be coupled to the heat sinking layer 329 so that the heat from mainboard 320 is directed to chassis 312 and not diverted to LCD 310. Therefore, when the temperature of the LCD 310 reaches above a certain temperature (e.g. upper temperature threshold 282), heat from the processor(s) of mainboard 320 is not directed to LCD 310 via heat conduction element 333.

Motion actuator 321 is coupled to heat conduction element 333 via link 331 so that motion actuator 321 can coupled and decoupled heat conduction element 333 with heat sinking surface 323, in the illustrated embodiment. Link 331 may be a thermal insulator to reduce heat transfer from heat conduction element 333 to motion actuator 321. Motion actuator 321 may include a voice coil or other micro-electro-mechanical system (MEMS) device.

In FIG. 3B, motion actuator 325 is coupled to chassis heat conduction element 337 via link 335 so that motion actuator 325 can coupled and decoupled chassis heat conduction element 337 with heat sinking surface 327, in the illustrated embodiment. Link 335 may be a thermal insulator to reduce heat transfer from chassis heat conduction element 337 to motion actuator 325. Motion actuator 325 may include a voice coil or other micro-electro-mechanical system (MEMS) device.

In one embodiment, thermal control logic 301 is configured to decouple the chassis heat conduction element 337 from the heat sinking layer 329 of mainboard 320 when the heat conduction element 333 is coupled to the heat sinking layer 329. This allows more heat from the processors to be directed to LCD 310 instead of being directed to both the chassis 312 and the LCD 310. Heat sinking surface 327 is included in the heat sinking layer 329, in some embodiments.

FIG. 3B includes an optional second temperature sensor 357 that is configured to generate a second temperature signal representative of a temperature of the one or more processors of mainboard 320. In one embodiment, thermal control logic 301 is configured to drive the second motion actuator 325 to couple the chassis heat conduction element 337 to the heat sinking layer 329 in response to the second temperature signal reaching a processor temperature threshold. In one embodiment, when the second temperature is above the processor temperature threshold, the thermal control logic 301 couples the chassis heat conduction element 337 to heat sinking surface 327 regardless of the temperature signal received from temperature sensor 353 to protect the one or more processors of mainboard 320 from overheating.

Figure 4:
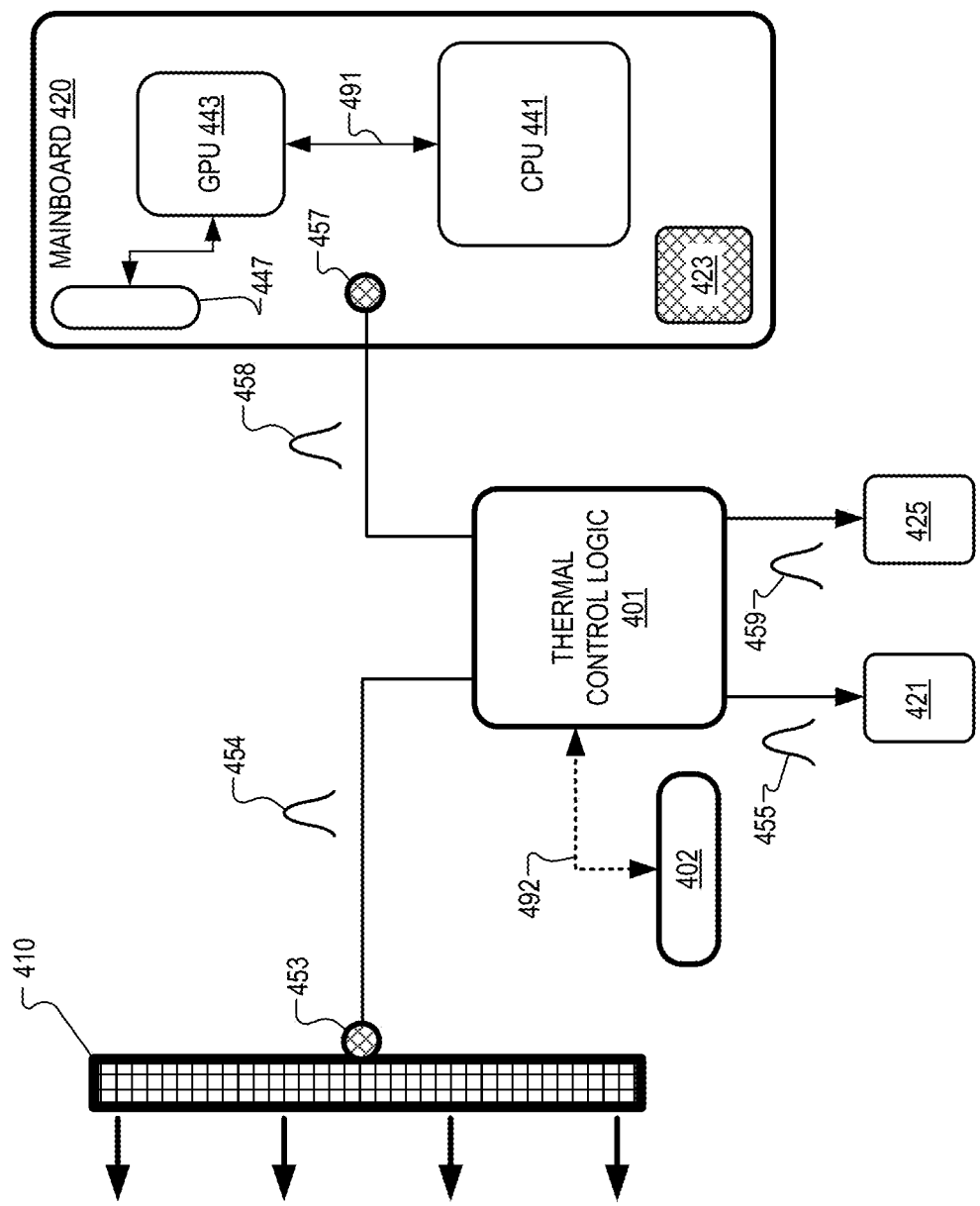
FIG. 4 illustrates an example block diagram schematic that includes thermal control logic configured to drive one or more motion actuators in response to one or more temperature signals, in accordance with an embodiment of the disclosure.

FIG. 4 illustrates an example block diagram schematic that includes thermal control logic 401 configured to drive one or more motion actuators in response to one or more temperature signals, in accordance with an embodiment of the disclosure. FIG. 4 includes thermal control logic 401, an LCD 410, a temperature sensor 453, a temperature signal 454, a first motion actuator 421, a second motion actuator 425, a second temperature sensor 457, and a second temperature signal 458. FIG. 4 also includes a mainboard 420 including a CPU 441 communicatively coupled to a GPU 443 via communication channel 491. GPU 443 is coupled to send image signals to image port 447 for delivery to LCD 410. A flex circuit of the LCD 410 (not illustrated) may be coupled to the image port 447 to deliver the image signals to the LCD 410.

In FIG. 4, temperature sensor 453 is coupled to a middle portion of the backside of LCD 410 and second temperature sensor 457 is coupled to mainboard 420. Temperature sensor 457 may be coupled to a heat sinking layer of mainboard 420. Heat sinking surface 423 of mainboard 420 may be a copper pad for coupling to heat conduction element 333 and heat sinking surface 423 may be included in the heat sinking layer of mainboard 420. A second copper pad (not illustrated) may be disposed on mainboard 420 on a side opposite heat sinking surface 423 to couple with chassis heat conduction element 337.

Thermal control logic 401 is configured to receive temperature signal 454 from temperature sensor 453 and also configured to receive second temperature signal 458 from second temperature sensor 457. Thermal control logic 401 may be configured to drive motion signals 455 and 459 onto motion actuators 421 and 425, respectively, in response to temperature signals 454 and 458. Thermal control logic 301 and/or 401 may include processing logic that includes one or more processors, microprocessors, multi-core processors, Application-specific integrated circuits (ASIC), and/or Field Programmable Gate Arrays (FPGAs) to execute operations disclosed herein. In the illustrated embodiment, thermal control logic 401 is optionally coupled to a memory 402 via communication channel 492. Memory 402 may store executable instructions and or data (e.g. lower temperature threshold 281 and upper temperature threshold 282) to be accessed by thermal control logic 401. In some embodiments, memories (not illustrated in FIG. 4) are integrated into the processing logic to store instructions to execute operations and/or store data. Processing logic may also include analog or digital circuitry to perform the operations in accordance with embodiments of the disclosure.

Figure 5:
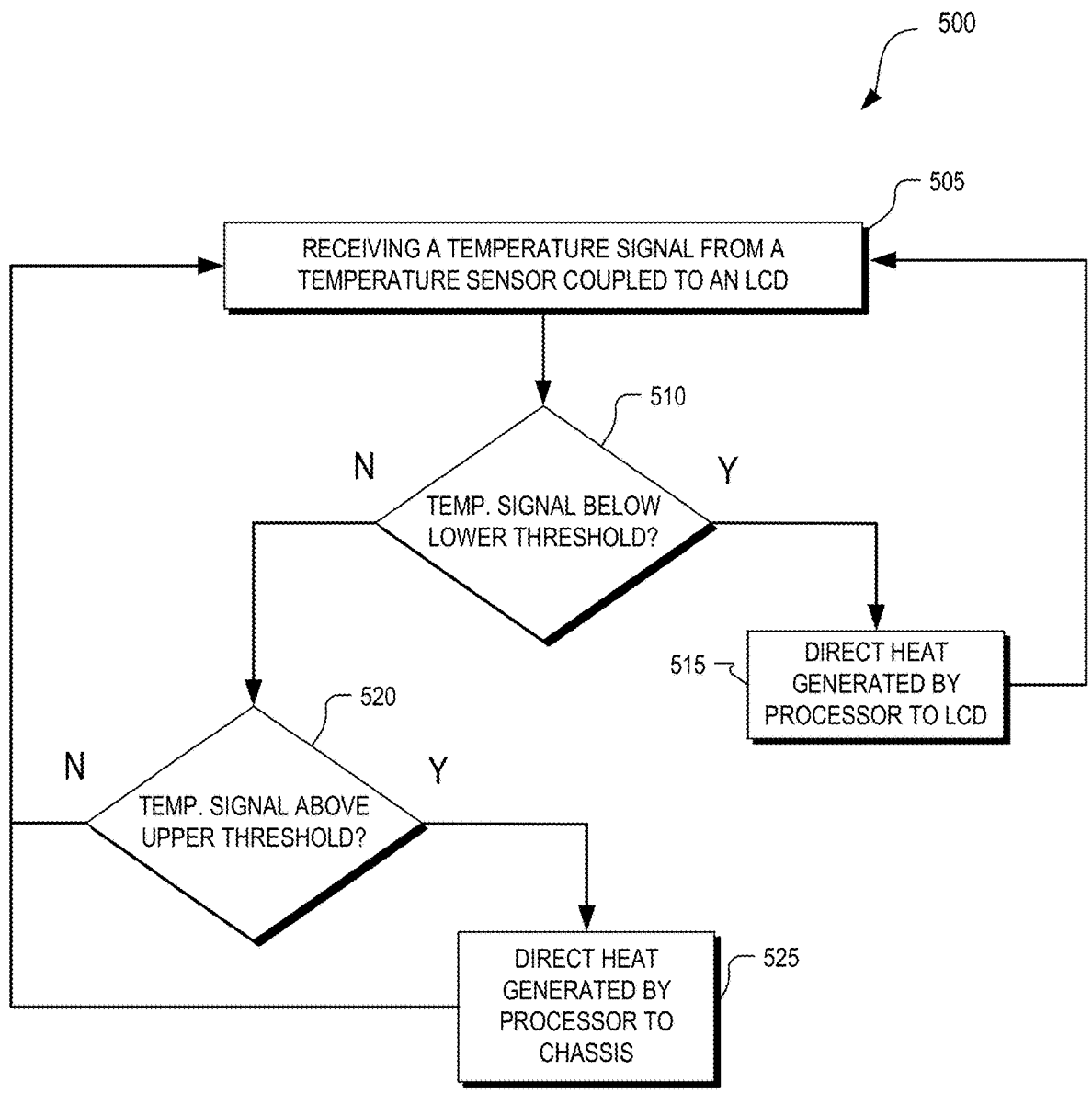
FIG. 5 illustrates a flow chart illustrating an example process of regulating liquid crystal temperature, in accordance with an embodiment of the disclosure.

FIG. 5 illustrates a flow chart illustrating an example process 500 of regulating liquid crystal temperature, in accordance with an embodiment of the disclosure. The order in which some or all of the process blocks appear in process 500 should not be deemed limiting. Rather, one of ordinary skill in the art having the benefit of the present disclosure will understand that some of the process blocks may be executed in a variety of orders not illustrated, or even in parallel. Process 500 may be executed by thermal control logic 301 or 401.

In process block 505, a temperature signal (e.g. 454) is received from a temperature sensor (e.g. 453) that is coupled to an LCD (e.g. LCD 410). After executing process block 505, example process 500 proceeds to process block 510.

In process block 510, if the temperature signal is below a lower temperature threshold (e.g. lower temperature threshold 281), process 500 proceeds to process block 515. If the temperatures signal is not below the lower temperature threshold, process 500 proceeds to process block 520.

In process block 515, heat generated by processors of a mainboard of an HMD is directed to the LCD. In one embodiment, directing the heat from the processor of the HMD to the LCD includes coupling a heat conduction element to a heat sinking layer coupled to sink heat from the processors. The heat conduction element may be disposed between the LCD and the heat sinking layer. In one embodiment, coupling the heat conduction element to the heat sinking layer include driving a motion signal (e.g. 455) onto a voice coil that is coupled to the heat conduction element. After executing process block 515, process 500 may return to process block 505.

In process block 520, if the temperature signal is above an upper temperature threshold (e.g. upper temperature threshold 282), process 500 proceeds to process block 525. If the temperatures signal is not above the upper temperature threshold, process 500 may return to process block 505.

In process block 525, heat generated by the processors of the mainboard of the HMD is directed to the chassis (e.g. 312). In one embodiment, directing the heat from the mainboard to the chassis includes coupling a chassis heat conduction element (e.g. 337) to the heat sinking layer coupled to sink heat from the processors. The chassis heat conduction element may be disposed between the heat sinking layer and the chassis. In one embodiment, coupling the chassis heat conduction element to the heat sinking layer include driving a motion signal (e.g. 459) onto a voice coil that is coupled to the chassis heat conduction element.

In one embodiment, process 500 further includes receiving a second temperature signal (e.g. 458) representative of a second temperature of the processors of the mainboard. The heat from the processors may be directed to the chassis of the HMD when the second temperature signal reaches a processor temperature threshold.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Although the disclosure is most significantly described in the context of an HMD, those skilled in the art recognize that embodiments of the disclosure could be utilized in any apparatus or computing device that includes an LCD and processors. A computing device may include a laptop computer, a tablet, a phablet, a smartphone, a feature phone, a smartwatch, or otherwise.

A "memory" or "memories" (e.g. 402) described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/ data storage disks, or other optical storage, magnetic cassettes, magnetic tape, magnetic disk storage or other magnetic storage devices, or any other non-transmission medium that can be used to store information for access by a computing device.

Communication channels 491 and 492 may include or be routed through one or more wired or wireless communication utilizing IEEE 802.11 protocols, BlueTooth, SPI (Serial Peripheral Interface), I$^2$C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A Head Mounted Display (HMD) comprising:
a heat sinking layer for receiving heat from a processor of the HMD;
a liquid crystal display (LCD) positioned to display images to a wearer of the HMD;
a temperature sensor configured to generate a temperature signal representative of a temperature of the LCD;
a heat conduction element disposed between the LCD and the heat sinking layer;
a motion actuator coupled to the heat conduction element; and
thermal control logic configured to receive the temperature signal from the temperature sensor, wherein the thermal control logic is configured to selectively transfer the heat to the LCD by selectively driving the motion actuator to couple the heat conduction element with the heat sinking layer in response to the temperature signal.

2. The HMD of claim 1, wherein the thermal control logic is configured to drive the motion actuator to couple the heat conduction element with the heat sinking layer when the temperature signal is below a lower temperature threshold, and wherein the thermal control logic is configured to drive the motion actuator to decouple the heat conduction element with the heat sinking layer when the temperature signal is above an upper temperature threshold.

3. The HMD of claim 1, wherein the HMD further comprises:
an LCD thermal layer coupled to the heat conduction element to distribute the heat across the LCD, wherein the LCD thermal layer is disposed across a backside of the LCD that is opposite a viewing side of the LCD.

4. The HMD of claim 1 further comprising:
a chassis; and
a chassis heat conduction element disposed between the chassis and the heat sinking layer, wherein the chassis heat conduction element is decoupled from the heat sinking layer when the heat conduction element is coupled to the heat sinking layer.

5. The HMD of claim 4 further comprising:
a second temperature sensor configured to generate a second temperature signal representative of a second temperature of the processor; and
a second motion actuator, wherein the thermal control logic is configured to drive the second motion actuator to couple the chassis heat conduction element to the heat sinking layer in response to the second temperature signal reaching a processor temperature threshold.

6. The HMD of claim 1 further comprising:
a flexible circuit board coupled between the LCD and a mainboard that includes the processor, wherein the flexible circuit board delivers image signals from the mainboard to the LCD, and wherein the temperature signal is routed through a conductor of the flexible circuit board.

7. The HMD of claim 1, wherein the motion actuator includes a voice coil.

8. The HMD of claim 1, wherein the heat conduction element includes at least one of copper or aluminum.

9. The HMD of claim 1, wherein the temperature sensor is disposed on the LCD.

10. The HMD of claim 1, wherein the processor includes at least one of a CPU or a GPU.

11. The HMD of claim 1, wherein the heat sinking layer includes an inner layer of a printed circuit board coupled to the processor.

12. The HMD of claim 1, wherein the thermal control logic is included in the processor.

13. An apparatus comprising:
one or more processors;
a heat sinking layer coupled to sink heat from the one or more processors;
a motion actuator for coupling to a heat conduction element; and
thermal control logic coupled to drive the motion actuator, wherein the thermal control logic is configured to receive a temperature signal representative of a temperature of a liquid crystal display (LCD), and wherein the thermal control logic is configured to selectively transfer the heat to the LCD by selectively driving the motion actuator to couple the heat conduction element with the heat sinking layer to form a thermal conduction path between the heat sinking layer and the LCD.

14. The apparatus of claim 13, wherein the thermal control logic is configured to drive the motion actuator to couple the heat conduction element with the heat sinking layer when the temperature signal is below a lower temperature threshold, and wherein the thermal control logic is configured to drive the motion actuator to decouple the heat conduction element with the heat sinking layer when the temperature signal is above an upper temperature threshold.

15. The apparatus of claim 13, wherein the apparatus includes an image port coupled to deliver image signals from the one or more processors to a flexible circuit board of the LCD, and wherein the temperature signal is received from a conductor included in the image port.

16. A computer-implemented method of regulating a temperature of liquid crystal in a Head Mounted Display (HMD), the method comprising:

receiving a temperature signal from a temperature sensor coupled to a Liquid Crystal Display (LCD) of the HMD;

directing heat generated by processors of the HMD to the LCD when the temperature signal is below a lower temperature threshold; and directing the heat from the processors of the HMD to a chassis of the HMD when the temperature signal is above an upper temperature threshold.

17. The computer-implemented method of claim 16, wherein directing the heat from the processors of the HMD to the LCD includes coupling a heat conduction element to a heat sinking layer coupled to sink the heat from the processors, wherein the heat conduction element is disposed between the LCD and the heat sinking layer.

18. The computer-implemented method of claim 17, wherein coupling the heat conduction element to the heat sinking layer includes driving a motion signal onto a voice coil that is coupled to move the heat conduction element.

19. The computer-implemented method of claim 16 further comprising:

receiving a second temperature signal representative of a second temperature of the processors; and directing the heat to the chassis of the HMD when the second temperature signal reaches a processor temperature threshold.

20. The computer-implemented method of claim 19, wherein directing the heat to the chassis of the HMD includes coupling a chassis heat conduction element to the heat sinking layer, wherein the chassis heat conduction element is disposed between the heat sinking layer and the chassis.

\* \* \* \* \*